United States Patent
Wu et al.

(10) Patent No.: US 8,653,877 B2
(45) Date of Patent: Feb. 18, 2014

(54) CURRENT MIRROR MODIFIED LEVEL SHIFTER

(75) Inventors: Che-Wei Wu, Taichung (TW); Meng-Fan Chang, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 13/349,982

(22) Filed: Jan. 13, 2012

(65) Prior Publication Data

US 2013/0181762 A1 Jul. 18, 2013

(51) Int. Cl.
*H03L 5/00* (2006.01)

(52) U.S. Cl.
USPC .................. 327/333; 326/80; 326/81

(58) Field of Classification Search
USPC ........................ 327/333; 326/80, 81
See application file for complete search history.

(56) References Cited

U.S. PATENT DOCUMENTS

| | | | | |
|---|---|---|---|---|
| 5,469,080 A | * | 11/1995 | Son .................................. | 326/81 |
| 6,798,243 B1 | * | 9/2004 | Nguyen et al. .................. | 326/68 |
| 7,034,573 B1 | * | 4/2006 | Chang ............................. | 326/68 |
| 7,124,221 B1 | * | 10/2006 | Zerbe et al. .................... | 710/106 |
| 7,295,038 B2 | * | 11/2007 | Seo .................................. | 326/81 |
| 7,518,412 B2 | * | 4/2009 | Hasegawa et al. ............. | 327/66 |
| 7,777,547 B2 | | 8/2010 | Luo | |
| 7,852,131 B2 | * | 12/2010 | Hwang et al. ................. | 327/144 |

* cited by examiner

*Primary Examiner* — Kenneth B. Wells
(74) *Attorney, Agent, or Firm* — Muncy, Geissler, Olds & Lowe, PLLC (57) ABSTRACT

A current mirror modified level shifter includes a pair of PMOS including a PMOS ($M_{PL}$) and a PMOS ($M_{PR}$), wherein a Vot node connected to a drain of the PMOS ($M_{PR}$); a pair of NMOS including NMOS ($M_{NL}$) and a NMOS ($M_{NR}$), wherein sources of the PMOS ($M_{PL}$) and the PMOS ($M_{PR}$) are coupled to a high voltage (HV), respectively; gates of the PMOS ($M_{PL}$) and the PMOS ($M_{PR}$) coupled together through a Vm node which located between the gates of the PMOS ($M_{PL}$) and the PMOS ($M_{PR}$); and a suspended PMOS ($M_{PM}$) coupled to drain of the PMOS ($M_{PL}$), the Vm node being coupled to a Va node between drain of the suspend PMOS ($M_{PM}$) and drain of the NMOS ($M_{NL}$).

8 Claims, 7 Drawing Sheets

CURRENT MIRROR MODIFIED LEVEL SHIFTER

FIELD OF THE INVENTION

The present invention generally relates to a level shifter, and especially to a current mirror level shifter.

DESCRIPTION OF THE PRIOR ART

Recently, consumer electronic devices such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed.

For particular applications, an IC can be integrated with other ICs on an integrated circuit board (PCB). The ICs may have different operating voltages; therefore, it may be a requirement to use more than one power supply voltage setting in order to accommodate the various operating conditions of the ICs. The IC communicates with other ICs in a system using an input/output with higher or lower voltage level. In general, the low internal voltage of the IC may be electrically separated from the high I/O voltage. Therefore, the internal core circuits and I/O circuits may be coupled to different power supplies. For instance, an IC with high voltage elements can use a separate high power supply voltage to operate the circuits properly. The circuits that use the higher power supply voltage and the circuits that use other supply voltages can communicate with each other using a level shifter. A level shifter is a type of circuit that translates logical signals of one voltage level to logical signals of another voltage level.

Samsung Electronics Co., Ltd. (KR) disclosed a level shifter in U.S. Pat. No. 7,295,038, entitled "Digital circuits having current mirrors and reduced leakage current", filed on Aug. 15, 2005. The leakage current control circuit may include a fourth PMOS transistor MP42. The output compensation circuit may include a fifth PMOS transistor MP41. The leakage current control circuit may reduce leakage current from the level control circuit by pulling up the gate voltages of the transistors MP11 and MP12 in the level control circuit to VDD2. The output compensation circuit may reduce leakage current of the output buffer by maintaining a first output signal at a high level based on a level of the first output signal. Namely, the level shifter of the prior art employed fourth PMOS transistor and fifth PMOS transistor. The structure is too complicated.

Mediatek Inc. also disclosed a type of level shifter in U.S. Pat. No. 7,777,547, entitled "Level shifter for high-speed and low-leakage operation". The prior art disclosed a voltage level shifter capable of interfacing between two circuit systems having different operating voltage swings. The voltage level shifter comprises an input buffer having a low supply voltage for inverting an external input signal to an internal input signal, and an output buffer having a high supply voltage for inverting the internal input signal to an external output signal. The high level of the external input signal is lower than the high level of the external output signal. The voltage level shifter is designed such that the input buffer is operating to achieve a low-leakage and high-speed performance. The structure includes too many devices and the scheme is still too complicated.

Figure 1A:
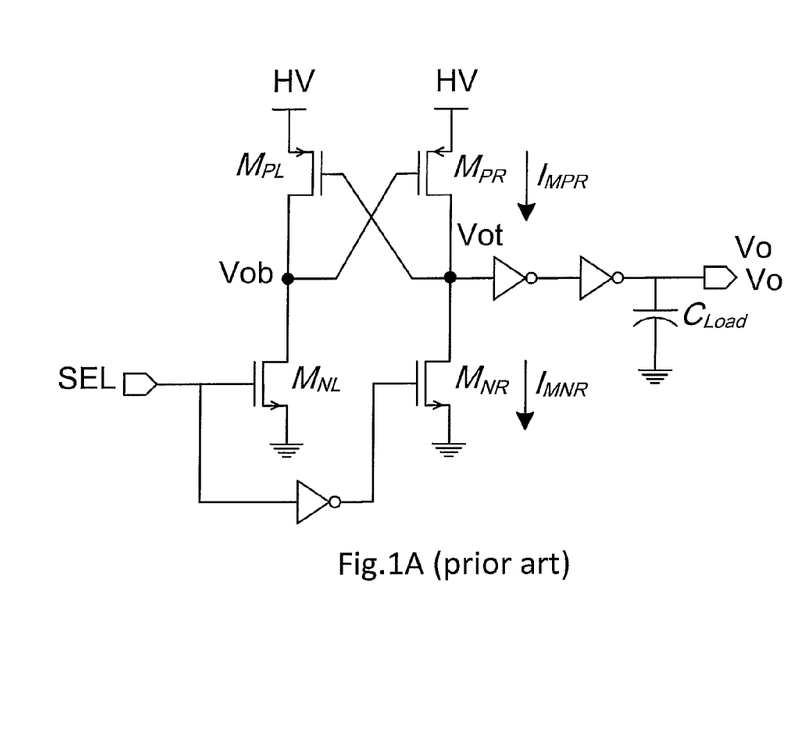
FIGS. 1A and 1B show an embodiment of the level shifter according to prior art.
Figure 1B:
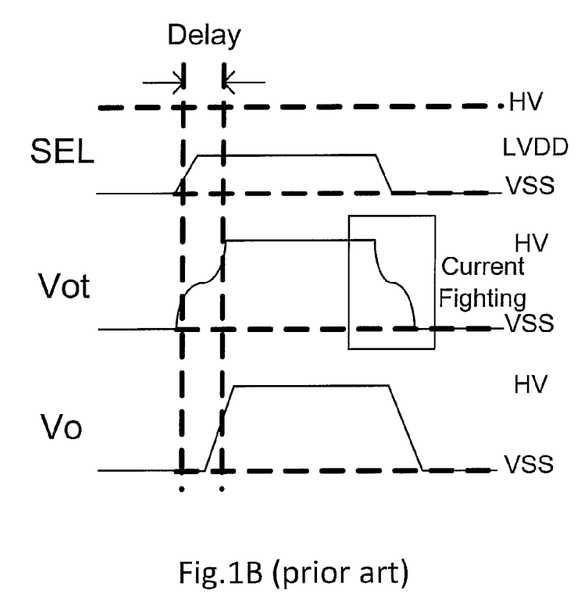
Figure 2A:
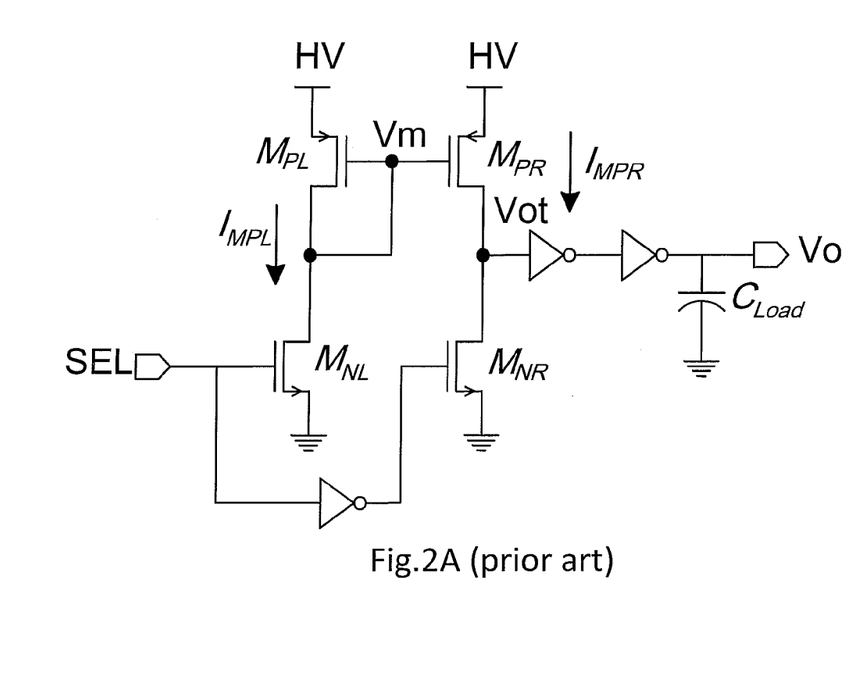
FIGS. 2A and 2B show an embodiment of the level shifter according to prior art.
Figure 2B:
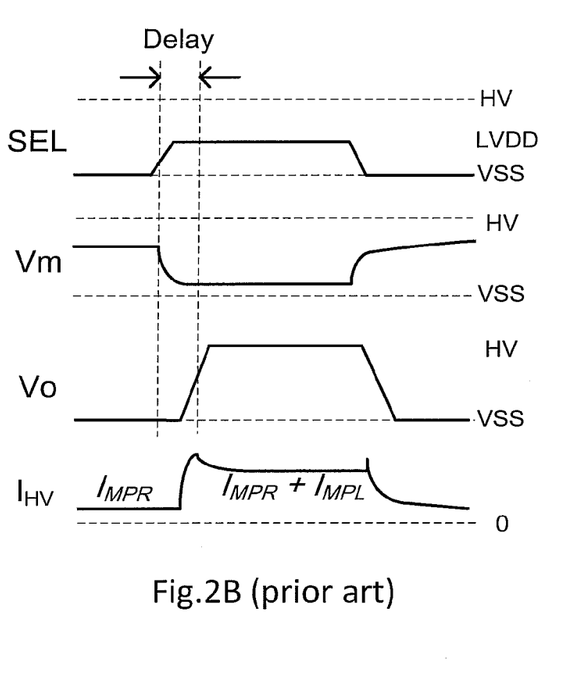

FIG. 1A of the present applications shows a conventional half latch type level shifter. The scheme includes a pair of PMOS coupled to HV respectively. The gates of the pair PMOS are respectively coupled to nodes of Vob and Vot, followed by connecting to a pair of NMOS which have a grounding terminal for each one. A fighting issue occurs during the end of operation cycle as shown in FIG. 1B. The fighting issue will consume charge pump power. It also suffers the large area consumption ($M_{NR}$) issue. In order to solve the issue, FIG. 2A illustrates another conventional current mirror level shifter. Based on the FIG. 1A scheme, the conventional current mirror level shifter of FIG. 2A removes the cross couple structure and implants a node between the gates of the pair of PMOS, and another node located between PMOS ($M_{PL}$) and NMOS ($M_{NL}$). The node between the gates is connected to the node between PMOS ($M_{PL}$) and NMOS ($M_{NL}$) to solve the prior art issue. However, the scheme also generates leakage issue which causes the signal delay as shown in FIGS. 2A and 2B. The leakage is:

$$I_{HV} = \begin{cases} I_{MPR}, & \text{when } SEL \text{ is low} \\ I_{MPR} + I_{MPL}, & \text{when } SEL \text{ is high} \end{cases}$$

Figure 3:
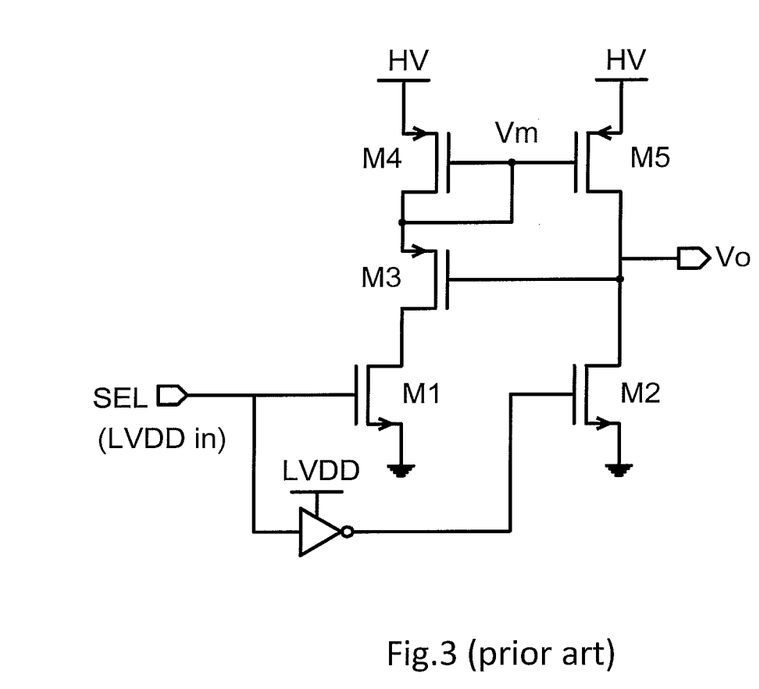
FIG. 3 shows another embodiment of the level shifter according to prior art.

FIG. 3 shows further current mirror level shifter consisting of a pair of PMOS M4, M5 and a pair of NMOS M1, M2. The current mirror level shifter has additional PMOS M3 between the PMOS M4 and NMOS M1, however, the scheme cannot have full swing result.

What is desired is a simplified current mirror level shifter.

SUMMARY OF THE INVENTION

An aspect of the present invention is to provide a simplified current mirror level shifter to solve the power consumption issue and reduce the leakage.

The present invention provides a current mirror modified level shifter which includes a pair of PMOS consisting of a PMOS ($M_{PL}$) and a PMOS ($M_{PR}$), wherein a Vot node is connected to a drain of the PMOS ($M_{PR}$); a pair of NMOS consists of an NMOS ($M_{NL}$) and an NMOS ($M_{NR}$), wherein sources of the PMOS ($M_{PL}$) and the PMOS ($M_{PR}$) are coupled to a high voltage (HV), respectively; gates of the PMOS ($M_{PL}$) and the PMOS ($M_{PR}$) are coupled together through a Vm node which located between the gates of the PMOS ($M_{PL}$) and the PMOS ($M_{PR}$); and a suspended PMOS ($M_{PM}$) is coupled to drain of the PMOS ($M_{PL}$), the Vm node is coupled to a Va node between drain of the suspend PMOS ($M_{PM}$) and drain of the NMOS ($M_{NL}$).

A voltage shifter PMOS ($M_{PS}$) is coupled between gates of the PMOS ($M_{PL}$) and the PMOS ($M_{PR}$). A source of the voltage shifter PMOS ($M_{PS}$) is coupled to the gate of the PMOS ($M_{PL}$), and a drain of the voltage shifter PMOS ($M_{PS}$) is coupled to the gate of the PMOS ($M_{PR}$). A gate of the voltage shifter PMOS ($M_{PS}$) is coupled to a conductive line between the Vm node and the Va node. An output is coupled a node between the Vot node and a drain of the NMOS ($M_{NR}$) through two inverters there between. A selection pad is coupled to gates of the NMOS ($M_{NL}$) and the NMOS ($M_{NR}$) via an inverter to invert the SEL signal to the gate of the NMOS ($M_{NR}$).

A current mirror modified level shifter includes a pair of PMOS consisting of a PMOS ($M_{PL}$) and a PMOS ($M_{PR}$), wherein a Vot node is connected to a drain of the PMOS ($M_{PR}$); a pair of NMOS consists of NMOS ($M_{NL}$) and a NMOS ($M_{NR}$), wherein sources of the PMOS ($M_{PL}$) and the PMOS ($M_{PR}$) are coupled to a high voltage (HV), respectively; gates of the PMOS ($M_{PL}$) and the PMOS ($M_{PR}$) are coupled together through a Vm node which located between the gates of the PMOS ($M_{PL}$) and the PMOS ($M_{PR}$); and a voltage shifter PMOS ($M_{PS}$) is coupled between gates of the PMOS ($M_{PL}$) and the PMOS ($M_{PR}$).

A source of the voltage shifter PMOS ($M_{PS}$) is coupled to the gate of the PMOS ($M_{PL}$), and a drain of the voltage shifter PMOS ($M_{PS}$) is coupled to the gate of the PMOS ($M_{PR}$). A gate of the voltage shifter PMOS ($M_{PS}$) is coupled to a conductive line between the Vm node and a Va node between the PMOS ($M_{PL}$) and NMOS ($M_{NL}$). An output is coupled a node between the Vot node and a drain of the NMOS ($M_{NR}$) through two inverters there between. A selection pad is coupled to gates of the NMOS ($M_{NL}$) and an inverter, and the output of the inverter is coupled to the gate of the NMOS ($M_{NR}$) to invert the SEL signal to the gate of the NMOS ($M_{NR}$).

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

The present invention provides a current mirror modified level shifter, having a pair of PMOS consisting of a PMOS ($M_{PL}$) and a PMOS ($M_{PR}$), and a pair of NMOS consisting of NMOS ($M_{NL}$) and a NMOS ($M_{NR}$). A suspended PMOS ($M_{PM}$) is coupled to drain of the PMOS ($M_{PL}$) to reduce the consumption power. Sources of the PMOS ($M_{PL}$) and the PMOS ($M_{PR}$) are coupled to a high voltage (HV), respectively; the gates of the PMOS ($M_{PL}$) and the PMOS ($M_{PR}$) coupled together through a Vm node which located between the gates of the PMOS ($M_{PL}$) and the PMOS ($M_{PR}$). A voltage shifter PMOS ($M_{PS}$) is employed to reduce the leakage, thereby improving the performance of the level shifter.

Figure 4A:
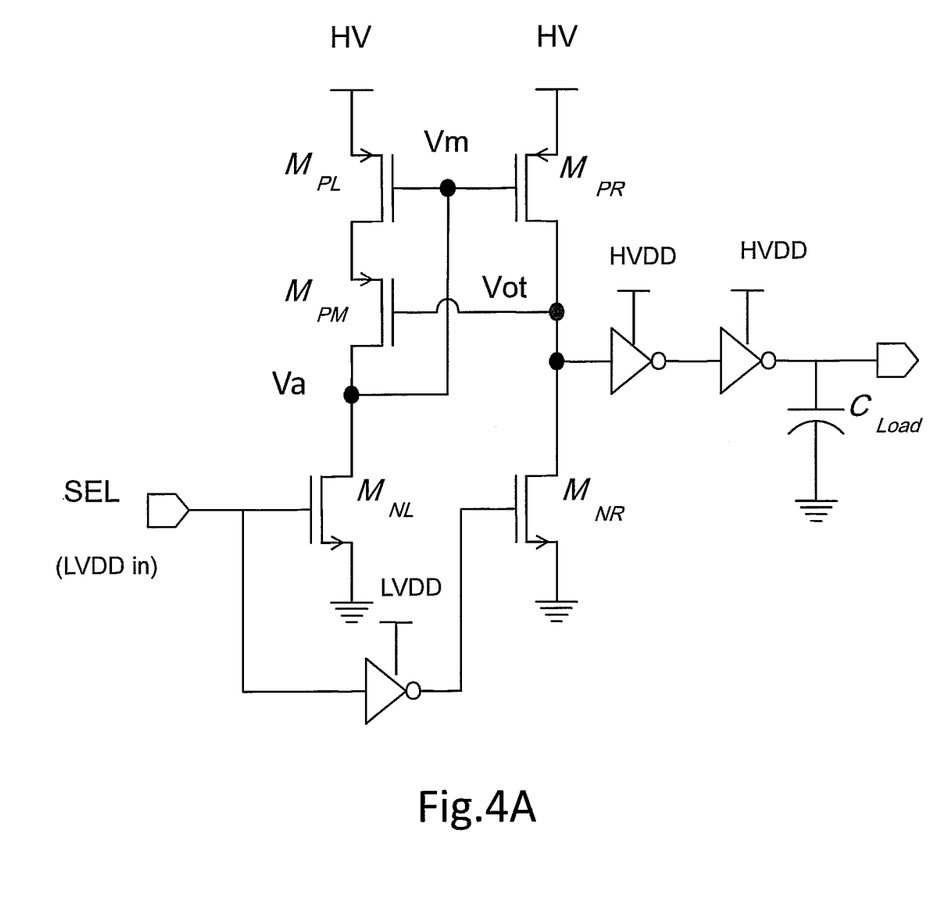
FIGS. 4A and 4B show an embodiment of the level shifter according to the present invention.

Please refer to FIG. 4A, the present invention generally relates to a level shifter with current mirror modified (CMM) scheme. The scheme includes a pair of PMOS ($M_{PL}$ and $M_{PR}$) and a pair of NMOS ($M_{NL}$ and $M_{NR}$). The source terminals of the pair of PMOS ($M_{PL}$ and $M_{PR}$) are coupled to the high voltage (HV), respectively. The gates of the pair of PMOS are coupled together through a node Vm which located between the gates of the pair of PMOS ($M_{PL}$ and $M_{PR}$). A Vot node is connected to the drain terminal of one of the pair of the PMOS. A drain terminal of another one of the pair of the PMOS is connected to the source of additional suspended PMOS ($M_{PM}$). The Vm node is coupled to the node Va which is connected to the drain terminal of the suspend PMOS ($M_{PM}$). The gate of the suspend PMOS ($M_{PM}$) is coupled to the Vot.

The drain of the NMOS ($M_{NL}$) of the pair of NMOS is coupled to the node Va and the source terminal is ground; the gate of the NMOS ($M_{NL}$) is coupled to the selection pad (SEL). Further, the drain of the NMOS ($M_{NR}$) of the pair of NMOS is coupled to the node Vot and the source terminal is ground; the gate of the NMOS ($M_{NR}$) is coupled to the output of and inverter which located between the selection pad (SEL) and an inverter, wherein the output of the inverter is coupled to the gate NMOS ($M_{NR}$). Finally, the output terminal of the CMM level shifter is coupled the node between the drain of the NMOS ($M_{NR}$) and the node Vot through a buffer, for example, the buffer may include two inverters.

Figure 4B:
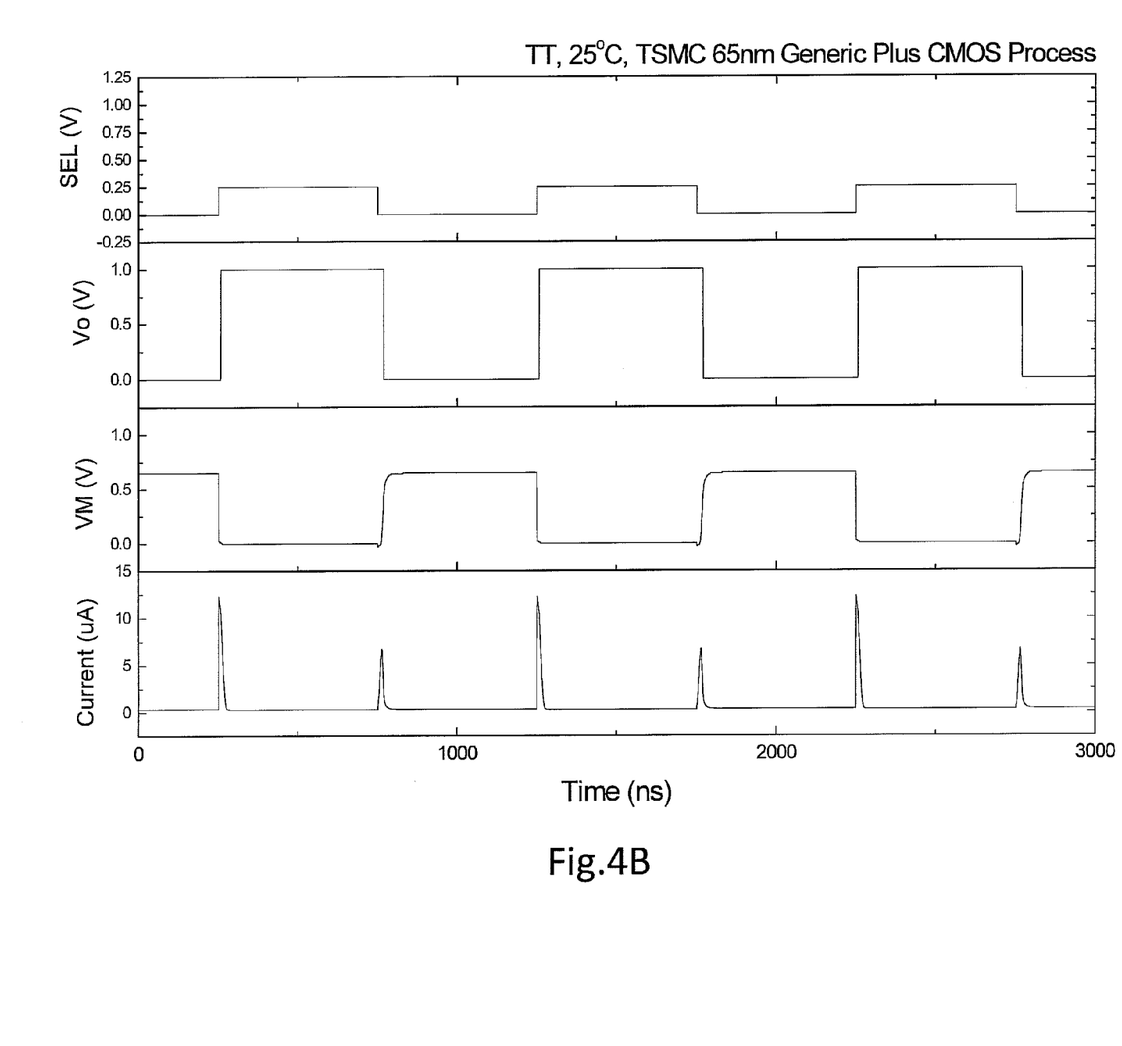

The suspend PMOS may block the DC current. When the SEL go high, NMOS ($M_{NL}$) turn on, then the Vot will go high as well and thereby turning off the $M_{PM}$ to reduce the power consumption. The power consumption is low which may refer to the result shown in FIG. 4B.

Figure 5A:
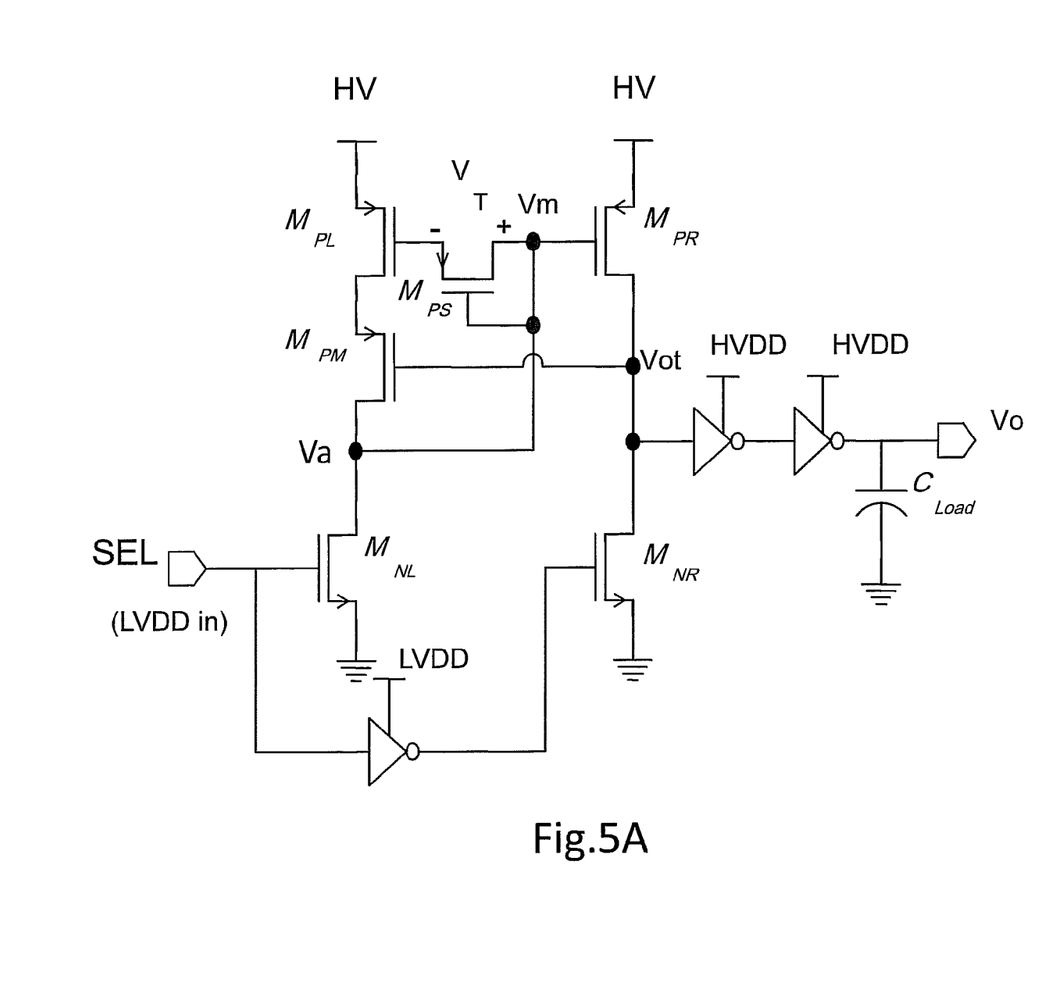
FIGS. 5A and 5B show an embodiment of the level shifter according to the present invention.
Figure 5B:
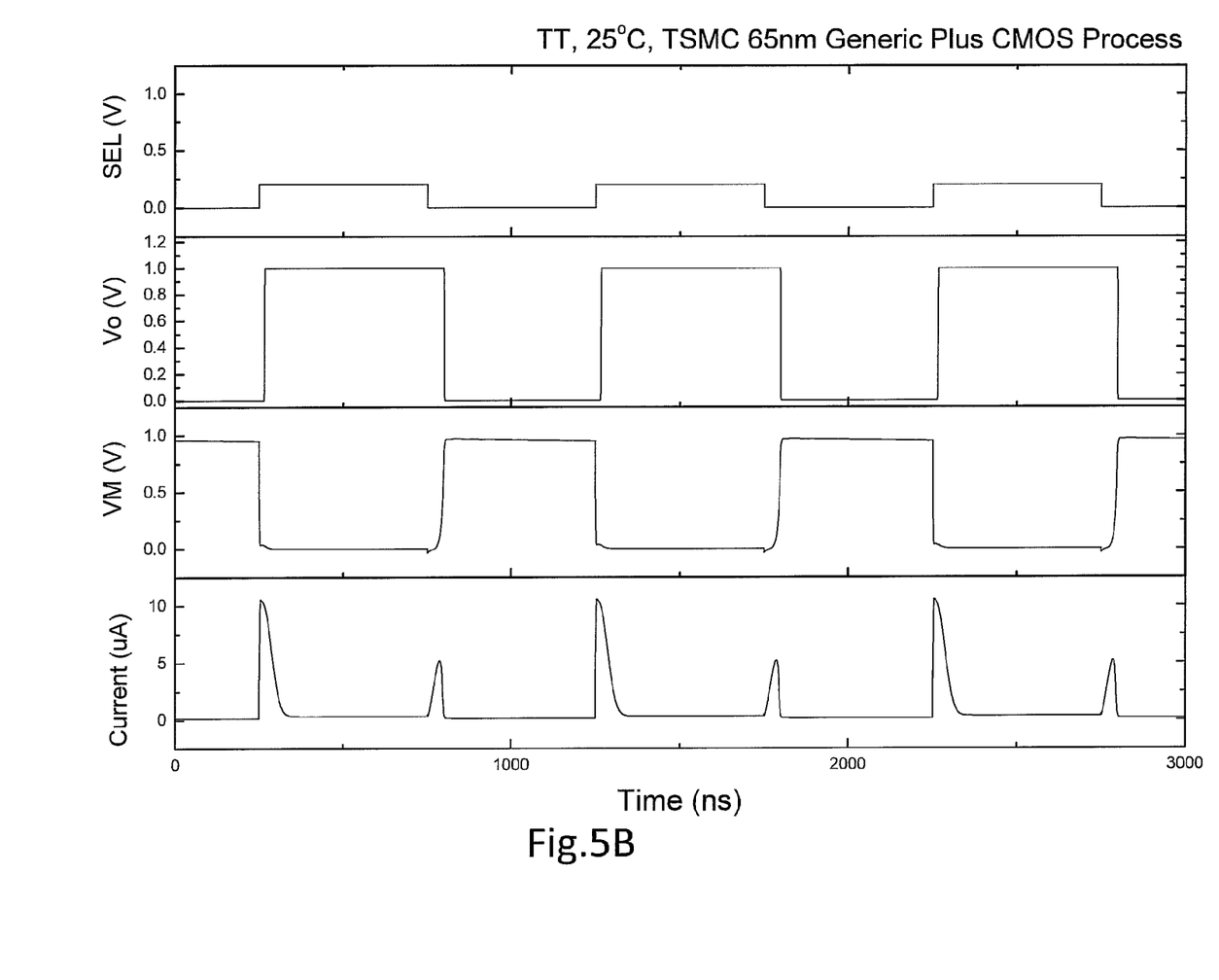

Please refer to FIG. 5A, it illustrates another embodiment of the present invention. Based on the scheme (Current mirror modified enhancement level shifter; CMME) of FIG. 5A, most of the scheme is similar with FIG. 4A, a voltage shifter PMOS ($M_{PS}$) is introduced between the gate terminals of the pair of the PMOSs ($M_{PL}$ and $M_{PR}$) to raise the Vm voltage. The source of the PMOS ($M_{PS}$) is coupled to the gate of the PMOS ($M_{PL}$), while the drain of the PMOS ($M_{PS}$) is coupled to the gate of the PMOS ($M_{PR}$). The gate of the PMOS ($M_{PS}$) is coupled to the conductive line between the node Vm and the node Va. When the SEL is at low stage, then the Vm node goes Vdd (high stage) to reduce the leakage, please refer to FIG. 5B.

For the present approaches, the present invention provides a suspended PMOS ($M_{PM}$) and/or voltage shifter PMOS ($M_{PS}$) to reduce the power consumption and/or to reduce the leakage, thereby improving the performance of the level shifter.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A current mirror modified level shifter, comprising:
   a pair of PMOS including a PMOS ($M_{PL}$) and a PMOS ($M_{PR}$), wherein a Vot node is connected to a drain of said PMOS ($M_{PR}$);
   a pair of NMOS including a NMOS ($M_{NL}$) and a NMOS ($M_{NR}$), wherein sources of said PMOS ($M_{PL}$) and said PMOS ($M_{PR}$) are coupled to a high voltage (HV), respectively; gates of said PMOS ($M_{PL}$) and said PMOS ($M_{PR}$) are coupled together through a Vm node which is located between said gates of said PMOS ($M_{PL}$) and said PMOS ($M_{PR}$);
   a suspended PMOS ($M_{PM}$) coupled to drain of said PMOS ($M_{PL}$), said Vm node being coupled to a Va node between drain of said suspended PMOS ($M_{PM}$) and drain of said NMOS ($M_{NL}$); and
   a voltage shifter PMOS ($M_{PS}$) coupled between gates of said PMOS ($M_{PL}$) and said PMOS ($M_{PR}$).

2. The current mirror modified level shifter according to claim 1, wherein a source of said voltage shifter PMOS ($M_{PS}$) is coupled to said gate of said PMOS ($M_{PL}$), and a drain of said voltage shifter PMOS ($M_{PS}$) is coupled to said gate of said PMOS ($M_{PR}$).

3. The current mirror modified level shifter according to claim 2, wherein a gate of said voltage shifter PMOS ($M_{PS}$) is coupled to a conductive line between said Vm node and said Va node.

4. The current mirror modified level shifter according to claim 1, wherein an output is coupled between said Vot node and a drain of said NMOS ($M_{NR}$) through a buffer.

5. The current mirror modified level shifter according to claim 1, wherein a selection pad is coupled to gates of said NMOS ($M_{NL}$) and an inverter, wherein an output of said inverter is coupled to said gate of the NMOS ($M_{NR}$).

6. A current mirror modified level shifter, comprising:
   a pair of PMOS including a PMOS ($M_{PL}$) and a PMOS ($M_{PR}$), wherein a Vot node is connected to a drain of said PMOS ($M_{PR}$);
   a pair of NMOS including a NMOS ($M_{NL}$) and a NMOS ($M_{NR}$), wherein sources of said PMOS ($M_{PL}$) and said PMOS ($M_{PR}$) are coupled to a high voltage (HV), respectively; gates of said PMOS ($M_{PL}$) and said PMOS ($M_{PR}$) are coupled together through a Vm node which is located between said gates of said PMOS ($M_{PL}$) and said PMOS ($M_{PR}$);
   a suspended PMOS ($M_{PM}$) coupled to drain of said PMOS ($M_{PL}$), said Vm node being coupled to a Va node between drain of said suspended PMOS ($M_{PM}$) and drain of said NMOS ($M_{NL}$);
   a voltage shifter PMOS ($M_{PS}$) coupled between gates of said PMOS ($M_{PL}$) and said PMOS ($M_{PR}$); and
   wherein a gate of said voltage shifter PMOS ($M_{PS}$) is coupled to a conductive line between said Vm node and said Va node.

7. The current mirror modified level shifter according to claim 6, wherein an output is coupled between said Vot node and a drain of said NMOS ($M_{NR}$).

8. The current mirror modified level shifter according to claim 6, wherein a selection pad is coupled to gates of said NMOS ($M_{NL}$) and an inverter, wherein an output of said inverter is coupled to said gate of the NMOS ($M_{NR}$).

* * * * *